(12) United States Patent
Wu et al.

(10) Patent No.: US 11,587,845 B2
(45) Date of Patent: Feb. 21, 2023

(54) SEMICONDUCTOR STRUCTURE

(71) Applicant: TAIWAN SEMICONDUCTOR MANUFACTURING COMPANY LTD., Hsinchu (TW)

(72) Inventors: Chi-Hsi Wu, Hsinchu (TW); Wensen Hung, Hsinchu County (TW); Tsung-Shu Lin, New Taipei (TW); Shih-Chang Ku, Taipei (TW); Tsung-Yu Chen, Hsinchu (TW); Hung-Chi Li, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 11 days.

(21) Appl. No.: 17/396,565

(22) Filed: Aug. 6, 2021

(65) Prior Publication Data
US 2021/0366805 A1    Nov. 25, 2021

Related U.S. Application Data

(60) Continuation of application No. 16/725,255, filed on Dec. 23, 2019, now Pat. No. 11,088,048, which is a
(Continued)

(51) Int. Cl.
*H01L 21/00* (2006.01)
*H01L 23/367* (2006.01)
(Continued)

(52) U.S. Cl.
CPC ...... *H01L 23/3675* (2013.01); *H01L 21/4882* (2013.01); *H01L 25/0657* (2013.01); *H01L 25/50* (2013.01); *H01L 23/3733* (2013.01); *H01L 23/3736* (2013.01); *H01L 2224/16227* (2013.01); *H01L 2224/32225* (2013.01); *H01L 2224/73204* (2013.01); *H01L 2224/73253* (2013.01); *H01L 2225/06513* (2013.01);
(Continued)

(58) Field of Classification Search
CPC ............ H01L 23/3675; H01L 21/4882; H01L 25/0657
See application file for complete search history.

(56) References Cited

U.S. PATENT DOCUMENTS 8,803,306 B1 * 8/2014 Yu ...................... H01L 23/49822
                                                    438/109
9,054,228 B2 * 6/2015 Choi ....................... H01L 24/97
(Continued)

*Primary Examiner* — Laura M Menz
(74) *Attorney, Agent, or Firm* — WPAT Law; Anthony King

(57) ABSTRACT

The present disclosure provides a semiconductor structure. The semiconductor structure includes a substrate, a die stack disposed over the substrate, a heat spreader disposed over the substrate and having a surface facing the substrate, and a thermal interface material (TIM) disposed between the die stack and the heat spreader. A bottommost die of the die stack includes a surface exposed from remaining dies of the die stack from a top view perspective; and the TIM is in contact with the exposed surface of the bottommost die and the surface of the heat spreader, and is in contact with a sidewall of at least one of the plurality of dies of the die stack.

20 Claims, 8 Drawing Sheets

Related U.S. Application Data division of application No. 15/878,776, filed on Jan. 24, 2018, now Pat. No. 10,515,867.

(60) Provisional application No. 62/585,819, filed on Nov. 14, 2017.

(51) Int. Cl.
*H01L 21/48* (2006.01)
*H01L 25/065* (2023.01)
*H01L 25/00* (2006.01)
*H01L 23/373* (2006.01)

(52) U.S. Cl.
CPC ............ *H01L 2225/06517* (2013.01); *H01L 2225/06568* (2013.01); *H01L 2225/06589* (2013.01); *H01L 2924/15311* (2013.01); *H01L 2924/18161* (2013.01); *H01L 2924/19105* (2013.01)

(56) References Cited

U.S. PATENT DOCUMENTS

| | | | |
|---|---|---|---|
| 9,269,694 B2* | 2/2016 | Chen | H01L 23/3675 |
| 9,287,240 B2* | 3/2016 | Li | H01L 23/5385 |
| 9,397,078 B1* | 7/2016 | Chandolu | H01L 25/18 |
| 9,525,054 B2* | 12/2016 | Chiang | H01L 29/7783 |
| 9,595,506 B2* | 3/2017 | Chen | H01L 21/52 |
| 9,780,079 B2* | 10/2017 | Li | H01L 25/50 |
| 9,806,002 B2* | 10/2017 | Choudhury | H01L 23/3735 |
| 9,853,176 B2* | 12/2017 | Li | H01L 31/0687 |
| 9,899,493 B2* | 2/2018 | Chiang | H01L 29/66462 |
| 10,062,665 B2* | 8/2018 | Chen | H01L 21/52 |
| 10,461,014 B2* | 10/2019 | Lin | H01L 23/3135 |
| 10,483,187 B2* | 11/2019 | Yu | H01L 24/97 |
| 10,515,867 B2* | 12/2019 | Wu | H01L 25/0657 |
| 10,867,884 B2* | 12/2020 | Yu | H01L 24/94 |
| 10,867,885 B2* | 12/2020 | Yu | H01L 24/80 |
| 11,088,048 B2* | 8/2021 | Wu | H01L 21/4882 |
| 2012/0007229 A1* | 1/2012 | Bartley | H01L 23/3677 438/122 |
| 2012/0063095 A1* | 3/2012 | Sinha | H01L 21/563 361/714 |
| 2014/0203429 A1* | 7/2014 | Yu | H01L 24/19 257/737 |
| 2014/0264821 A1* | 9/2014 | Tang | H01L 21/4882 257/713 |
| 2014/0299980 A1* | 10/2014 | Choi | H01L 23/481 257/698 |
| 2015/0035134 A1* | 2/2015 | Hung | H01L 24/92 257/712 |
| 2015/0035135 A1* | 2/2015 | Hung | H01L 23/3672 257/712 |
| 2015/0108628 A1* | 4/2015 | Yu | H01L 23/3675 257/712 |
| 2015/0155218 A1* | 6/2015 | Hung | H01L 23/3677 257/713 |
| 2015/0155221 A1* | 6/2015 | Chen | H01L 24/81 257/690 |
| 2015/0162307 A1* | 6/2015 | Chen | H01L 21/56 438/107 |
| 2015/0228591 A1* | 8/2015 | Kim | H01L 21/563 438/109 |
| 2016/0013115 A1* | 1/2016 | Vadhavkar | H01L 25/16 257/713 |
| 2016/0013173 A1* | 1/2016 | Vadhavkar | H01L 23/44 438/109 |
| 2016/0133602 A1* | 5/2016 | Chen | H01L 23/3128 438/107 |
| 2016/0284670 A1* | 9/2016 | Hung | H01L 25/50 |
| 2016/0343687 A1* | 11/2016 | Vadhavkar | H01L 23/3675 |
| 2017/0148767 A1* | 5/2017 | Hung | H01L 25/0657 |
| 2017/0162542 A1* | 6/2017 | Chen | H01L 21/56 |
| 2017/0186665 A1* | 6/2017 | Choudhury | H01L 23/42 |
| 2017/0345732 A1* | 11/2017 | Hung | H01L 23/3677 |
| 2018/0108592 A1* | 4/2018 | Hembree | H01L 23/367 |
| 2019/0006263 A1* | 1/2019 | Yu | H01L 21/4871 |
| 2019/0067157 A1* | 2/2019 | Lin | H01L 25/50 |
| 2019/0148261 A1* | 5/2019 | Wu | H01L 21/4882 257/684 |
| 2020/0013697 A1* | 1/2020 | Yu | H01L 24/80 |
| 2020/0013698 A1* | 1/2020 | Yu | H01L 25/50 |
| 2020/0135610 A1* | 4/2020 | Wu | H01L 25/0657 |
| 2021/0366805 A1* | 11/2021 | Wu | H01L 25/50 |

* cited by examiner

SEMICONDUCTOR STRUCTURE

PRIORITY CLAIM AND CROSS-REFERENCE

This application is a continuation application of U.S. patent application Ser. No. 16/725,255, entitled "SEMICONDUCTOR STRUCTURE" filed on Dec. 23, 2019, which is a division of U.S. patent application Ser. No. 15/878,776, entitled "SEMICONDUCTOR STRUCTURE AND MANUFACTURING METHOD THEREOF" filed on Jan. 24, 2018; each of the U.S. patent applications claims the benefit of U.S. provisional application Ser. No. 62/585,819 filed on Nov. 14, 2017 and entitled "Semiconductor Structure and Manufacturing Method Thereof"; each of these applications are incorporated herein by reference in their entireties.

BACKGROUND

Electronic equipment using semiconductor structures is essential for many modern applications. With the advancement of electronic technology, the semiconductor structures are becoming steadily compact while having greater functionality and greater amounts of integrated circuitry. With the increasing functionality and compact scale of the semiconductor structure, numerous manufacturing operations are implemented with increased complexity.

The manufacturing operations of the semiconductor structure involve many steps and operations on a compact semiconductor structure. The manufacturing of the semiconductor structure with an increased interconnect density is becoming increasingly complicated. An increase in complexity of manufacturing the semiconductor structure may result in deficiencies such as degraded electrical performance or other issues, resulting in a high yield loss of the semiconductor structure and increase of manufacturing cost. As such, there are many challenges for modifying a structure of the semiconductor structures and improving the manufacturing operations.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
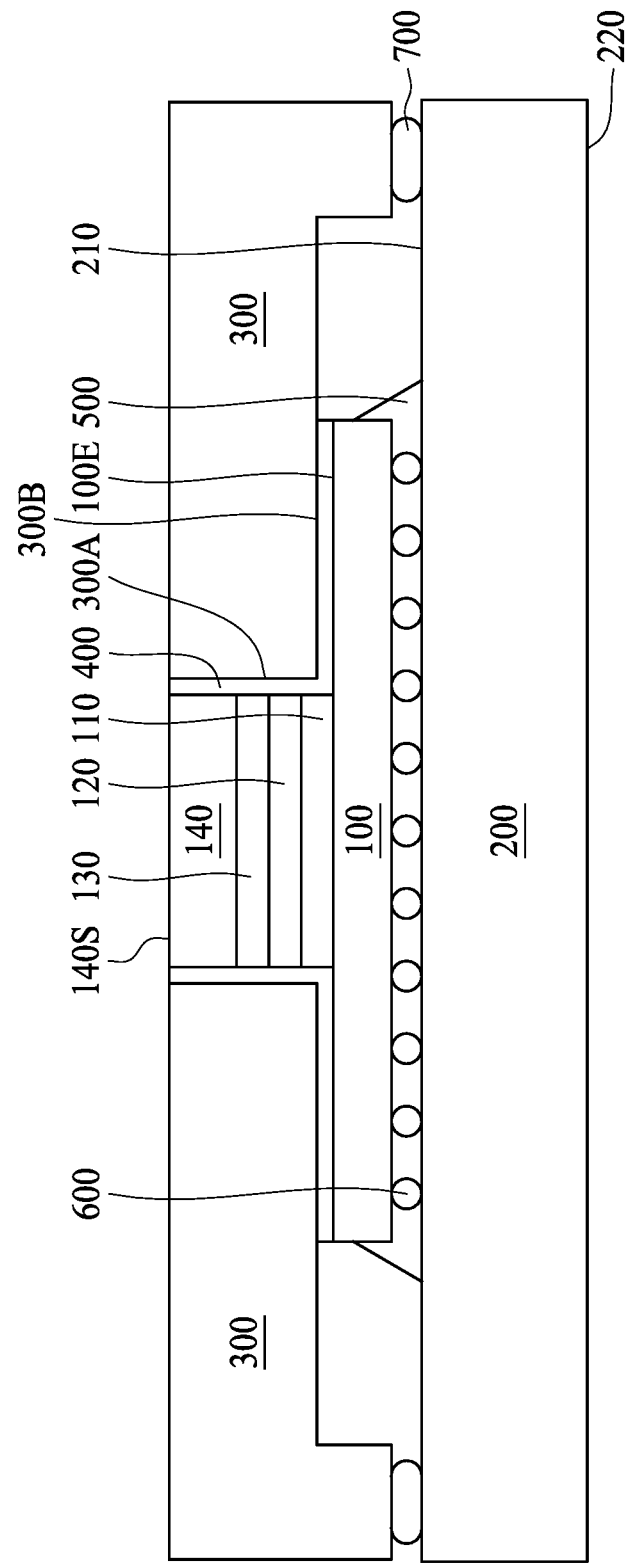
FIG. 1 is a cross-sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled," and the term "connected" may be termed as "electrically connected." "Coupled" and "connected" may also be used to indicate that two or more elements cooperate or interact with each other.

Other features and processes may also be included. For example, testing structures may be included to aid in the verification testing of 3D packaging or 3DIC devices. The testing structures may include, for example, test pads formed in a redistribution layer or on a substrate that allows the testing of the 3D packaging or 3DIC device, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

With the advancement of electronic technology, semiconductor or package structures are becoming steadily compact while having greater functionality and greater amounts of integrated circuitry. In order to further increase interconnect density or to reduce the interconnect length, multiple-chip structures or packages are realized by vertical stacking method with, for example, through silicon via (TSV), fine pitch micro bumps connection, etc. However, stacked dies may lead to heat dissipation issue. For example, heat generated by the structure may be trapped at the bottommost die (the die that is closest to a substrate, or the die that is farthest from a cooling device) or at an intermediate die of the stack, mainly due to the long distance from the conventional heat extraction means. As a result, the temperature of the die could exceed the allowable operational temperature and degrade the electrical performance of the structure.

Heat dissipation is one of the most critical issues in 3D IC packaging, which may include a high performance multiple-chip stacking structure such as a logic on logic (LoL) or a memory on logic (MoL) structure. An efficient heat dissipation solution is desired due to the high power density of stacked chips.

In some embodiments of the present disclosure, a semiconductor structure is disclosed. The semiconductor structure includes a substrate, a first die over the substrate, a second die over the first die, a heat spreader having a sidewall facing toward and proximal to a sidewall of the first die, and a thermal interface material (TIM) between the sidewall of the first die and the sidewall of the heat spreader. A thermal conductivity of the heat spreader is higher than a thermal conductivity of the TIM. In some embodiments of the present disclosure, the semiconductor structure includes a substrate, a block over the substrate and bonded with the substrate, a first die bonded on the block which has a surface exposed from the first die from a top view perspective, a second die over the first die, and a heat spreader having a surface facing toward and proximal to the exposed surface of the block. A thermal conductivity of the heat spreader is higher than a thermal conductivity of the block. The heat spreader can have metallic material and has a good thermal conductivity. As such, heat dissipation in a lateral or vertical (bottom) direction for the first die can be improved. The first die can be the bottommost die or an intermediate die in a stacked die structure, and therefore a high density multi-chip structure may be realized without overheat problem.

Figure 2:
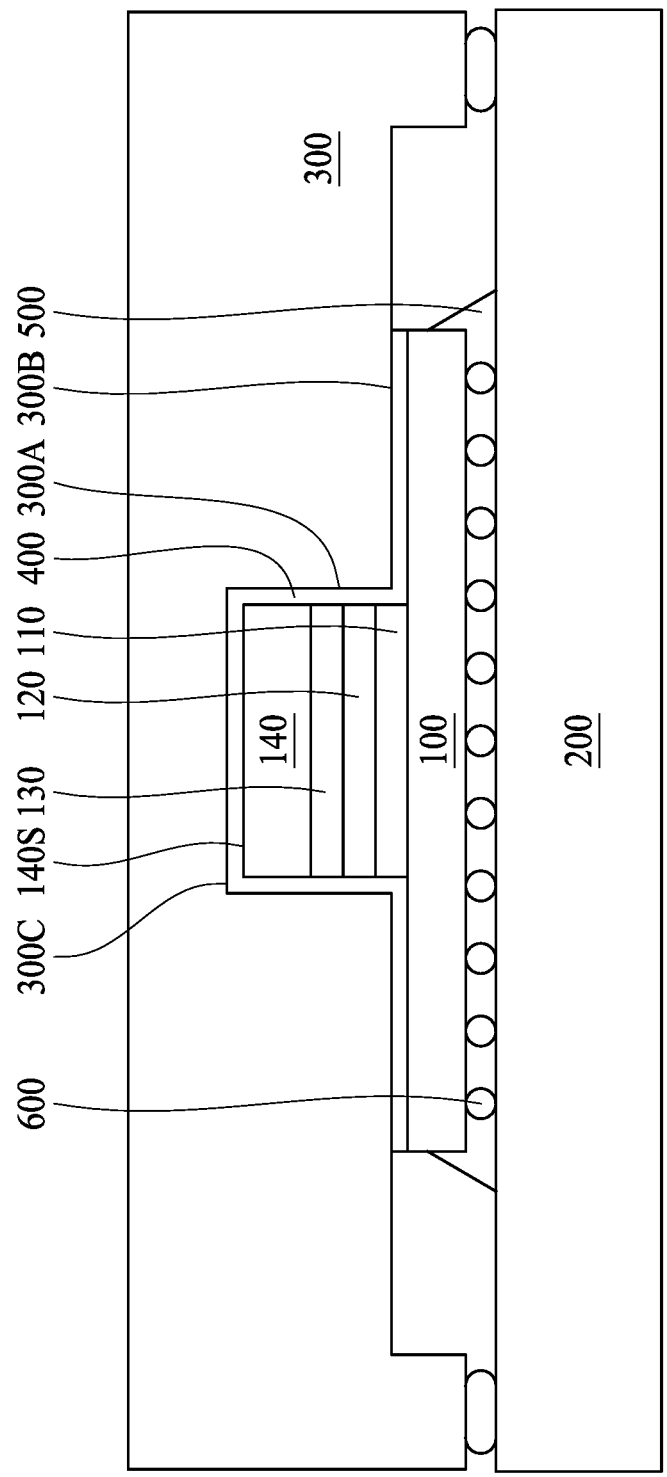
FIG. 2 is a cross-sectional view of a semiconductor structure in accordance with some embodiments of the present disclosure.
Figure 3:
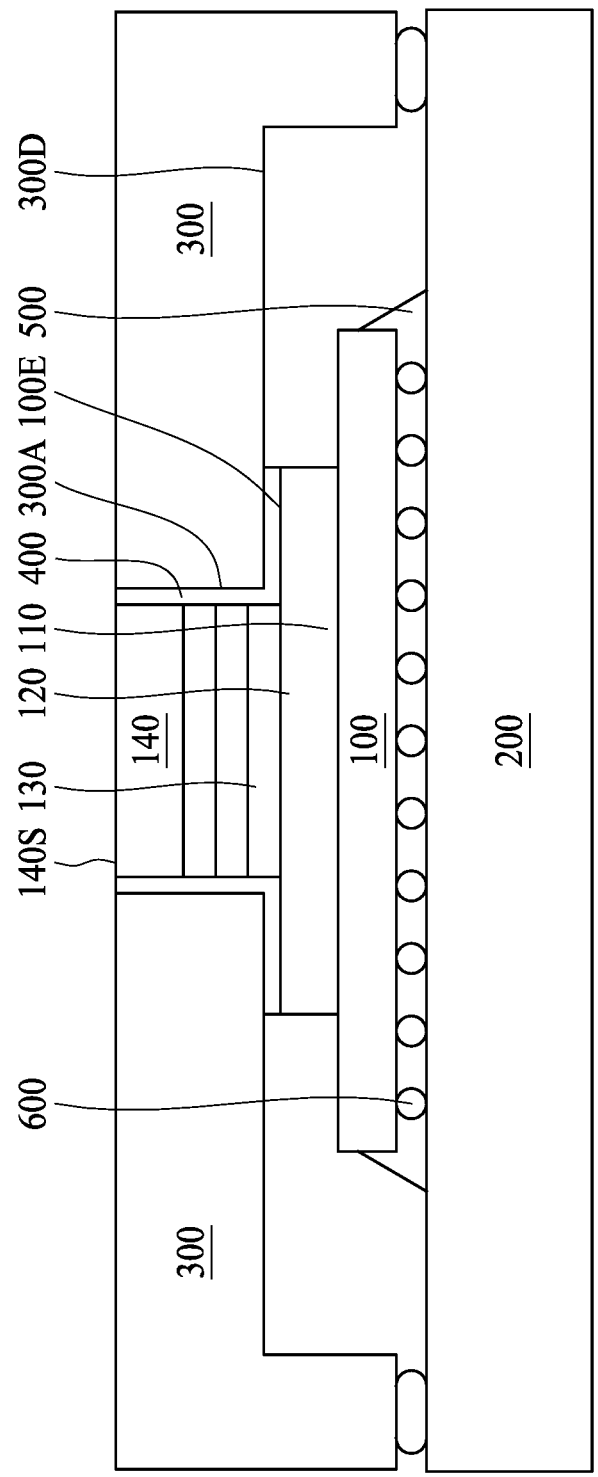
FIG. 3 is a cross-sectional view of a semiconductor structure in accordance with some embodiments of the present disclosure.

FIGS. 1 to 3 are examples of cross-sectional views of a semiconductor structure 1 in accordance with some embodiments of the present disclosure. The semiconductor structure 1 includes a substrate 200, a block 100, a first die 110, a second die 120, a third die 130, a fourth die 140, a heat spreader 300, a thermal interface material (TIM) 400, an insulation material 500, and several conductors 600. In some embodiments, the semiconductor structure 1 is a semiconductor package. In some embodiments, the semiconductor structure 1 is a multi-dimensional package such as a 3-dimensional (3D) package. In some embodiments, the semiconductor structure 1 is a part of an integrated fan-out (InFO) package. In some embodiments, the semiconductor structure 1 is a part of a chip on wafer (CoW) structure or a chip on wafer on substrate (CoWoS) structure. In some embodiments, the first die 110, the second die 120, the third die 130 and the fourth die 140 form a die cube or a die stack. In some embodiments, the die cube or the die stack includes one die or several dies stacked in one direction, such as a direction perpendicular to a first surface 210 of the substrate. The number of dies in the die cube or the die stack is not limited.

In some embodiments, the substrate 200 is fabricated with a predetermined functional circuit thereon. In some embodiments, the substrate 200 includes several conductive lines and several electrical components such as transistor, diode, etc. connected by the conductive lines. In some embodiments, the substrate 200 is a semiconductive substrate. In some embodiments, the substrate 200 is an interposer or a wafer. In some embodiments, the substrate 200 is a silicon substrate or silicon wafer. In some embodiments, the substrate 200 can be a printed circuit board (PCB). In some embodiments, the substrate 200 includes semiconductive material such as silicon, germanium, gallium, arsenic, and combinations thereof. In some embodiments, the substrate 200 includes material such as ceramic, glass, organic, etc. In some embodiments, the substrate 200 is a glass substrate or glass wafer. In some embodiments, the substrate 200 is in a quadrilateral, rectangular, square, polygonal or any other suitable shapes. In some embodiments, the substrate 200 includes a first surface 210 and a second surface 220 opposite to the first surface 210. In some embodiments, the first surface 210 is a front surface or an active surface where the circuits are disposed. In some embodiments, the second surface 220 is a back surface or an inactive surface. In some embodiments, some conductors such as solder bumps or metallic pads (not shown) are disposed in the vicinity of the second surface 220 for electrical connection with external components such as another PCB.

As shown in FIGS. 1 to 3, in some embodiments, the block 100 is disposed vertically over the substrate 200. In some embodiments, the block 100 is disposed over the first surface 210. In some embodiments, a gap is maintained between the block 100 and the substrate 200. In some embodiments, the block 100 is electrically connected to the substrate 200. In some embodiments, the block 100 is electrically connected to the substrate 200 by the conductors 600. In some embodiments, an area of the block 100 is smaller than an area of the substrate 200 from a top view perspective. In some embodiments, a portion of the first surface 210 is exposed from the block 100 from a top view perspective. In some embodiments, the exposed portion of the first surface 210 surrounds the block 100 from a top view perspective.

In some embodiments, the block 100 comprises semiconductive materials such as silicon, and the block 100 is fabricated with a predetermined functional circuit included within the block 100. The predetermined functional circuit is produced by operations such as photolithography, etching, deposition, etc. In some embodiments, the block 100 is singulated from a silicon wafer by a mechanical blade or a laser blade. In some embodiments, the block 100 is a chip, a device or the like. In some embodiments, the block 100 comprises a variety of electrical circuits suitable for a particular application. In some embodiments, the electrical circuits include various devices such as transistors, capacitors, resistors, diodes and/or the like. In some embodiments, the block 100 includes capacitor, resistor, inductor or the like. In some embodiments, the block 100 is an integrated passive device (IPD). In some embodiments, the block 100 is a logic device, graphics processing unit (GPU), application processing (AP) device, memory device, dynamic random access memory (DRAM) device, static random access memory (SRAM) device, high bandwidth memory (HBM) device or the like. In some embodiments, the block 100 generates heat when functioning. In some embodiments, the block 100 has a top-view cross section (i.e., a cross section of the semiconductor structure 1 as viewed from a top view perspective) having a quadrilateral, a rectangular or a square shape.

In some embodiments, the conductors 600 are disposed between the block 100 and the substrate 200. In some embodiments, the conductors 600 connect the block 100 and the substrate 200. In some embodiments, the conductors 600 comprise solder or ENEPIG. In some embodiments, the conductors 600 are controlled collapse chip connection (C4) bumps. In some embodiments, the conductor 600 has a cylindrical, hemispherical or spherical shape. In some embodiments, the conductors 600 include gold, silver, copper, nickel, tungsten, aluminum, titanium, palladium and/or alloys thereof.

In some embodiments, the insulation material 500 is disposed between the block 100 and the substrate 200. In some embodiments, the insulation material 500 is disposed on the first surface 210 of the substrate 200. In some embodiments, the insulation material 500 fills the gap between the block 100 and the substrate 200. In some embodiments, the insulation material 500 seals the gap. In some embodiments, the insulation material 500 surrounds the conductors 600. In some embodiments, the insulation material 500 seals or embeds the conductors 600. In some embodiments, the insulation material 500 at least partially covers a sidewall of the block 100. In some embodiments, the insulation material 500 surrounds a portion of the block 100. In some embodiments, a portion of the first surface 210 is exposed from the insulation material 500 from a top view perspective. In some embodiments, the exposed portion of the first surface 210 surrounds the insulation material 500 from a top view perspective. In some embodiments, the insulation material 500 includes resin, ABF resin or epoxy. In some embodiments, the insulation material 500 includes an underfill. In some embodiments, the insulation material 500 is configured to fix or strengthen the connection between the block 100 and the substrate 200 by the conductors 600. In some embodiments, the block 100 and the substrate 200 may be connected by other means such as die attach film (DAF).

In some embodiments, the first die 110, the second die 120, the third die 130 or the fourth die 140 comprises semiconductive materials such as silicon. In some embodiments, the first die 110, the second die 120, the third die 130 or the fourth die 140 is fabricated with a predetermined functional circuit. The predetermined functional circuit is produced by operations such as photolithography, etching, deposition, etc. In some embodiments, the first die 110, the second die 120, the third die 130 or the fourth die 140 is singulated from a silicon wafer by a mechanical blade or a laser blade. In some embodiments, the first die 110, the second die 120, the third die 130 or the fourth die 140 is a chip, a device or the like. In some embodiments, the first die 110, the second die 120, the third die 130 or the fourth die 140 comprises a variety of electrical circuits suitable for a particular application. In some embodiments, the electrical circuits include various devices such as transistors, capacitors, resistors, diodes and/or the like. In some embodiments, at least one of the first die 110, the second die 120, the third die 130, and the fourth die 140 includes capacitor, resistor, inductor or the like. In some embodiments, the first die 110, the second die 120, the third die 130 or the fourth die 140 is an integrated passive device (IPD). In some embodiments, the first die 110, the second die 120, the third die 130 or the fourth die 140 is a logic device, graphics processing unit (GPU), application processing (AP) device, memory device, dynamic random access memory (DRAM) device, static random access memory (SRAM) device, high bandwidth memory (HBM) device or the like. In some embodiments, the first die 110, the second die 120, the third die 130 or the fourth die 140 has a top-view cross section (i.e., a cross section of the semiconductor structure 1 as viewed from a top view perspective) having a quadrilateral, a rectangular or a square shape.

In some embodiments, the first die 110 is disposed vertically over the block 100. In some embodiments, the first die 110 is disposed on the block 100. In some embodiments, the first die 110 is bonded on the block 100. In some embodiments, the first die 110 is bonded on the block 100 by hybrid bonding. In some embodiments, the first die 110 is in contact with the block 100. In some embodiments, an area of the first die 110 is smaller than an area of the block 100 from a top view perspective. In some embodiments, a surface 100E of the block 100 is exposed from the first die 110 from a top view perspective. In some embodiments, the surface 100E of the block 100 extends laterally beyond an edge of the first die 110. In some embodiments, the surface 100E surrounds the first die 110 from a top view perspective.

In some embodiments, a circuit (not shown) is formed on a surface of the first die 110, the surface of the first die 110 facing the substrate 200. In some embodiments, a circuit is formed on a surface of the first die 110, the surface of the first die 110 facing away from the substrate 200. In the embodiments shown in FIGS. 1 to 3, the first die 110 is the bottommost die in the die stack. However, in other embodiments, the first die 110 may be an intermediate die or any die in the die stack. The position of the first die 110 in the stack is not limited.

In some embodiments, the second die 120 is disposed vertically over the first die 110. In some embodiments, the second die 120 is bonded on the first die 110. In some embodiments, the second die 120 is bonded on the first die 110 by hybrid bonding. In some embodiments, an area of the second die 120 is substantially the same as an area of the first die 110 from a top view perspective (as shown in FIGS. 1 to 2). In some embodiments, a sidewall of the second die 120 is coplanar with a sidewall of the first die 110. In some embodiments, an area of the second die 120 is smaller than an area of the first die 110 from a top view perspective (as shown in FIG. 3). In some embodiments, a surface 110E of the first die 110 is exposed from the second die 120 from a top view perspective. In some embodiments, the surface 110E of the first die 110 extends laterally beyond an edge of the second die 120. In some embodiments, the surface 110E surrounds the second die 120 from a top view perspective. In some embodiments, a circuit (not shown) is formed on a surface of the second die 120, the surface of the second die 120 facing the substrate 200. In some embodiments, a circuit is formed on a surface of the second die 120, the surface of the second die 120 facing away from the substrate 200.

In some embodiments, the third die 130 is disposed vertically over the second die 120. In some embodiments, the third die 130 is bonded on the second die 120. In some embodiments, the third die 130 is bonded on the second die 120 by hybrid bonding. In some embodiments, an area of the third die 130 is substantially the same as an area of the second die 120 from a top view perspective. In some embodiments, a sidewall of the third die 130 is coplanar with a sidewall of the second die 120. In some embodiments, a circuit (not shown) is formed on a surface of the third die 130, the surface of the third die 130 facing the substrate 200. In some embodiments, a circuit is formed on a surface of the third die 130, the surface of the third die 130 facing away from the substrate 200.

In some embodiments, the fourth die 140 is disposed vertically over the third die 130. In some embodiments, the fourth die 140 is bonded on the third die 130. In some embodiments, the fourth die 140 is bonded on the third die 130 by hybrid bonding. In some embodiments, an area of the fourth die 140 is substantially the same as an area of the third die 130 from a top view perspective. In some embodiments, a sidewall of the fourth die 140 is coplanar with a sidewall of the third die 130. In some embodiments, a circuit (not shown) is formed on a surface of the fourth die 140, the surface of the fourth die 140 facing the substrate 200. In some embodiments, a circuit is formed on a surface of the fourth die 140, the surface of the fourth die 140 facing away from the substrate 200. In some embodiments, within the die stack, the fourth die 140 is farthest from the substrate 200. In some embodiments, a surface of the fourth die 140 is exposed from the semiconductor structure 1, the surface of the fourth die 140 facing away from the substrate 200.

In some embodiments, the heat spreader 300 has a sidewall 300A facing toward and proximal to a sidewall of the first die 110, a sidewall of the second die 120, a side wall of the third die 130 or a sidewall of the fourth die 140. In some embodiments, the sidewall 300A is bonded with a sidewall of the first die 110, a sidewall of the second die 120, a side wall of the third die 130 or a sidewall of the fourth die 140. In some embodiments, the sidewall 300A is in contact with a sidewall of the first die 110, a sidewall of the second die 120, a side wall of the third die 130 or a sidewall of the fourth die 140. In some embodiments, the heat spreader 300 surrounds the first die 110, the second die 120, the third die 130 or the fourth die 140.

In some embodiments, the heat spreader 300 has a surface 300C facing toward and proximal to a surface 140S of the fourth die 140, the surface 140S facing away from the substrate 200. In some embodiments, the surface 300C is bonded with the surface 140S. In some embodiments, the bonding is by the TIM 400. In some embodiments, the surface 300C is in contact with the surface 140S. In some embodiments, the heat spreader 300 covers the first die 110, the second die 120, the third die 130 or the fourth die 140. In some embodiments, the surface 140S of the fourth die 140 is exposed from the heat spreader 300.

In some embodiments, the heat spreader 300 has a surface 300B facing toward and proximal to the surface 100E of the block 100, wherein the surface 100E is exposed from the first die 110 from a top view perspective. In some embodiments, the surface 300B is bonded with the surface 100E. In some embodiments, the surface 300B is bonded with the surface 100E by hybrid bonding. In some embodiments, the surface 300B is in contact with the surface 100E. In some embodiments, as shown in FIG. 3, the heat spreader 300 has a surface 300D facing toward and proximal to the surface 110E of the first die 110, wherein the surface 110E is exposed from the second die 120 from a top view perspective. In some embodiments, the surface 300D is bonded with the surface 110E. In some embodiments, the surface 300D is bonded with the surface 110E by hybrid bonding. In some embodiments, the bonding is by the TIM 400. In some embodiments, the surface 300D is in contact with the surface 110E. In some embodiments, a sidewall of the first die 110 is exposed from the heat spreader 300 or the block 100. In some embodiments, a sidewall of the first die 110 is exposed into air. In some embodiments, the heat spreader 300 is conformal to or lines along a topography of the die stack or the die cube.

In some embodiments, a portion of the heat spreader 300 is connected or fixed to the substrate 200. In some embodiments, a peripheral portion of the heat spreader 300 is bonded to the first surface 210 of the substrate 200 by a bonding material 700. In some embodiments, a gap or an enclosed space is formed or surrounded by the heat spreader 300, the substrate 200, the block 100, the insulation material 500 or the bonding material 700.

As shown in FIG. 1 to FIG. 3, in some embodiments, the thermal interface material (TIM) 400 is between the sidewall 300A of the heat spreader 300 and a sidewall of the first die 110, a sidewall of the second die 120, a side wall of the third die 130 or a sidewall of the fourth die 140. In some embodiments, the sidewall 300A is bonded with a sidewall of the first die 110, a sidewall of the second die 120, a side wall of the third die 130 or a sidewall of the fourth die 140 by the thermal interface material (TIM) 400. In some embodiments, the TIM 400 surrounds the first die 110, the second die 120, the third die 130 or the fourth die 140. In some embodiments, the TIM 400 is between the surface 300C of the heat spreader 300 and the surface 140S of the fourth die 140. In some embodiments, the TIM 400 is between the surface 300B of the heat spreader 300 and the surface 100E of the block 100. In some embodiments, the surface 300B is bonded with the surface 100E by the TIM 400. In some embodiments, the TIM 400 is between the surface 300D of the heat spreader 300 and the surface 110E of the first die 110 (as shown in FIG. 3). In some embodiments, a sidewall of the first die 110 is exposed from the TIM 400. In some embodiments, the TIM 400 is conformal to or lines along a topography of the die stack or the die cube.

In some embodiments, a thermal conductivity of the heat spreader 300 is higher than a thermal conductivity of the TIM 400, a thermal conductivity of the block 100, a thermal conductivity of the first die 110, a thermal conductivity of the second die 120, a thermal conductivity of the third die 130, or a thermal conductivity of the fourth die 140. In some embodiments, the thermal conductivity of the heat spreader 300 is between about 150 W/mK and about 450 W/mK. In some embodiments, the thermal conductivity of the heat spreader 300 is between about 370 W/mK and about 420 W/mK. In some embodiments, the thermal conductivity of the heat spreader 300 is between about 395 W/mK and about 405 W/mK. In some embodiments, the heat spreader 300 includes a material selected from a group consisting of aluminum, copper, copper alloy, copper tungsten, aluminum-silicon-carbide, graphite, and aluminum silicon carbide composite. In some embodiments, a thermal conductivity of the TIM 400 is between about 1 W/mK and about 10 W/mK. In some embodiments, the thermal conductivity of the TIM 400 is between about 3 W/mK and about 6 W/mK. In some embodiments, a ratio of the thermal conductivity of the heat spreader 300 to the thermal conductivity of the TIM 400 is between about 15 and about 450. In some embodiments, a ratio of the thermal conductivity of the heat spreader 300 to a thermal conductivity of the TIM 400 is between about 60 and about 140.

In some embodiments, the configuration of the heat spreader 300 or the TIM 400 is to improve the lateral or vertical (upper or bottom) heat dissipation for the first die 110, the second die 120, the third die 130, or the fourth die 140. In some embodiments, the first die 110 is the bottom-most die in the die stack and heat generated by the first die 110 is trapped and difficult to be released. The above configuration provides shorter heat dissipation routes to more efficiently release heat generated by a bottommost die or an intermediate die in a die stack by the heat spreader 300. In some embodiments, the configuration of the heat spreader 300 or the TIM 400 is to improve the heat dissipation for the block 100. For example, heat generated by the block 100 and trapped under the die stack may be dissipated through the surface 100E, the TIM 400, and the heat spreader 300, which forms a shorter heat dissipation route for the block 100.

Figure 4:
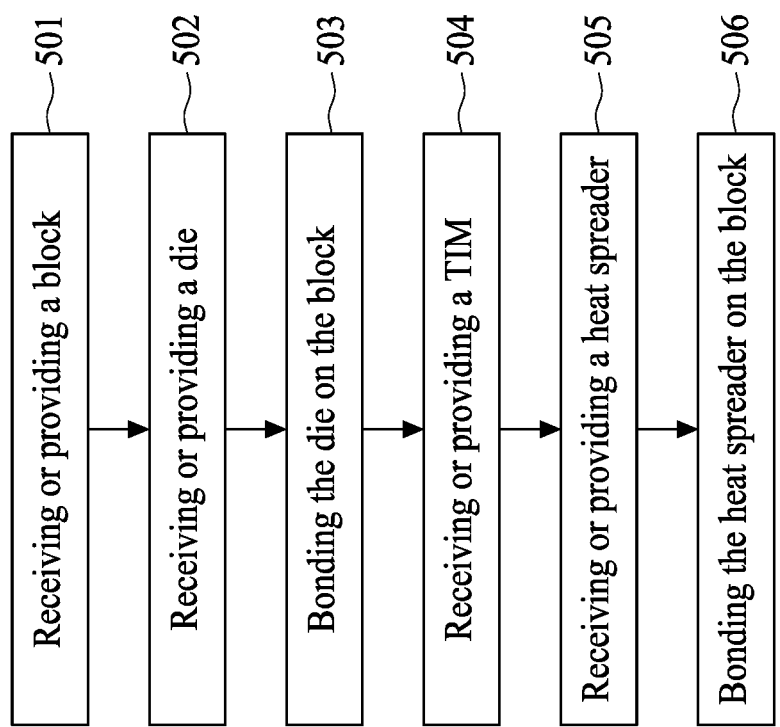
FIG. 4 is a flow diagram of a method of manufacturing a semiconductor structure in accordance with some embodiments of the present disclosure.

FIG. 4 is an embodiment of a method 5 of manufacturing a semiconductor structure. The method 5 includes a number of operations (501, 502, 503, 504, 505, and 506). The operation of the method 5 is not limited to the sequence order represented in accordance to the embodiment as shown in FIG. 4. For instance, operation 504 or operation 505 can precede operation 503.

Figure 5A:
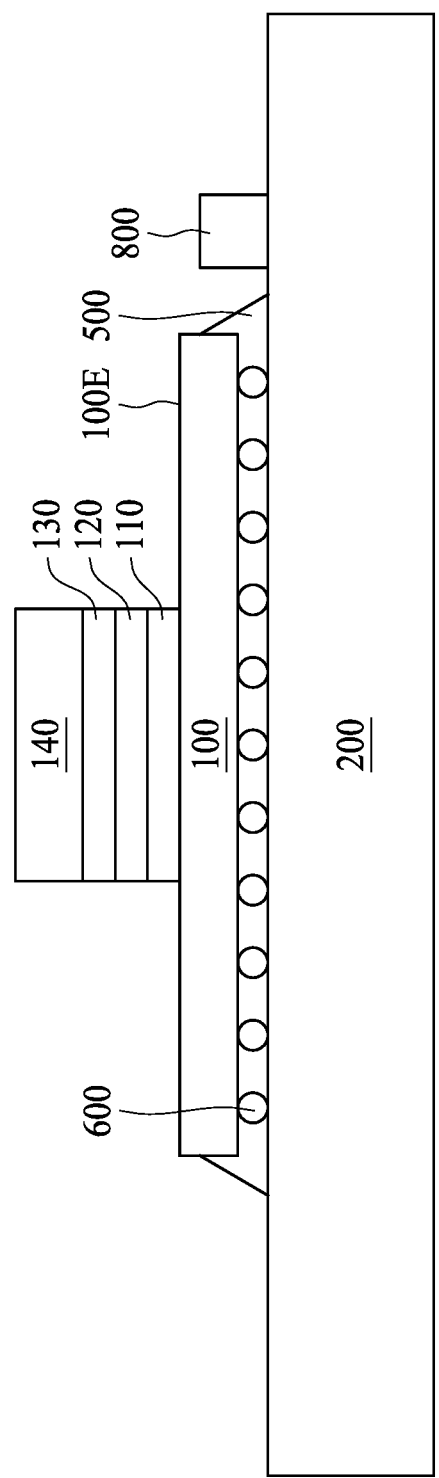
FIGS. 5A-5C' are cross-sectional views of manufacturing a semiconductor structure in accordance with some embodiments of the present disclosure.

FIG. 5A illustrates the operations 501 to 503. A block 100, a first die 110 are provided and the first die 110 is bonded on the block 100. In some embodiments, the first die 110 is bonded on the block 100 by hybrid bonding. In some embodiments, the first die 110 is bonded on the block 100 while exposing a surface 100E of the block 100 from a top view perspective. In some embodiments, the exposed surface 100E surrounds the first die 110. In some embodiments, a second die 120, a third die 130, and a fourth die 140 are provided and disposed on the first die in sequence to form a die stack. The number of the dies in the die stack is not limited. In some embodiments, the method 5 further includes operations of receiving a substrate 200, several conductors 600 and an insulation material 500. In some embodiments, an operation of bonding the block 100 on the substrate 200 through the conductors 600 is performed. In some embodiments, an operation of filling the insulation material 500 between the block 100 and the substrate 200 is performed. In some embodiments, operations of receiving an electronic device 800 and mounting the electronic device 800 on the substrate 200 are performed. In some embodiments, the block 100, the first die 110, the second die 120, the third die 130, the fourth die 140, the conductor 600, the insulation material 500, and the substrate 200 have similar configurations as the ones described above or illustrated in any one of FIG. 1 to FIG. 3.

Figure 5B:
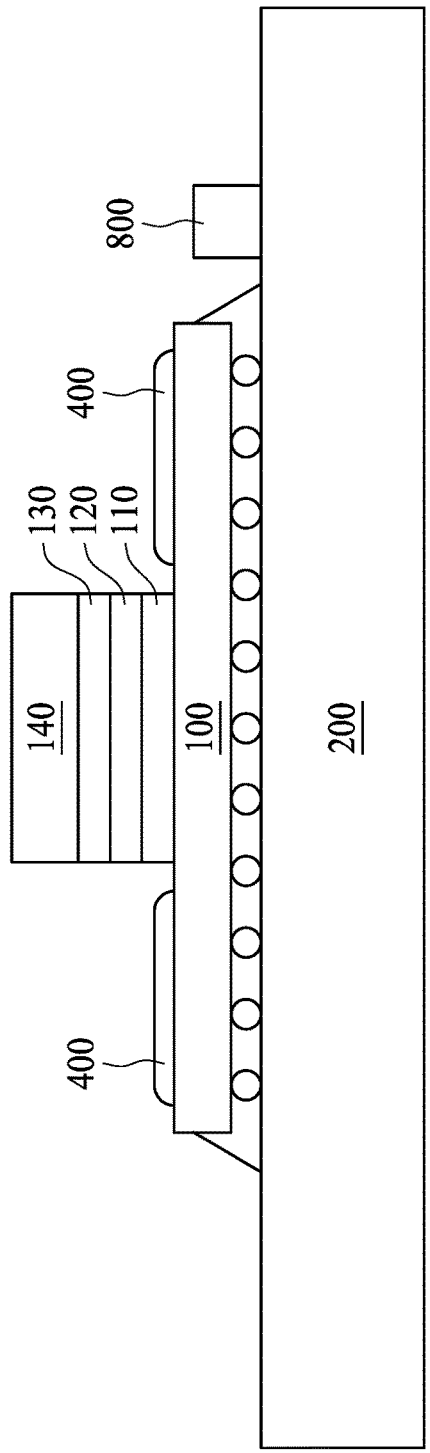
Figure 5B:
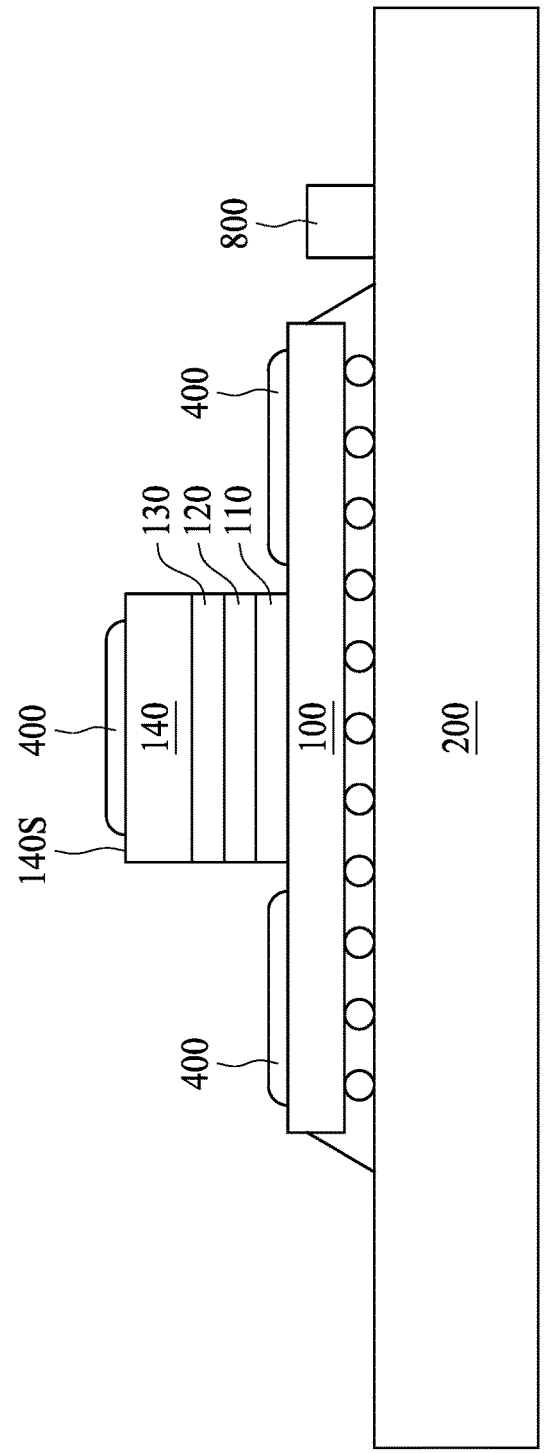
Figure 5C:
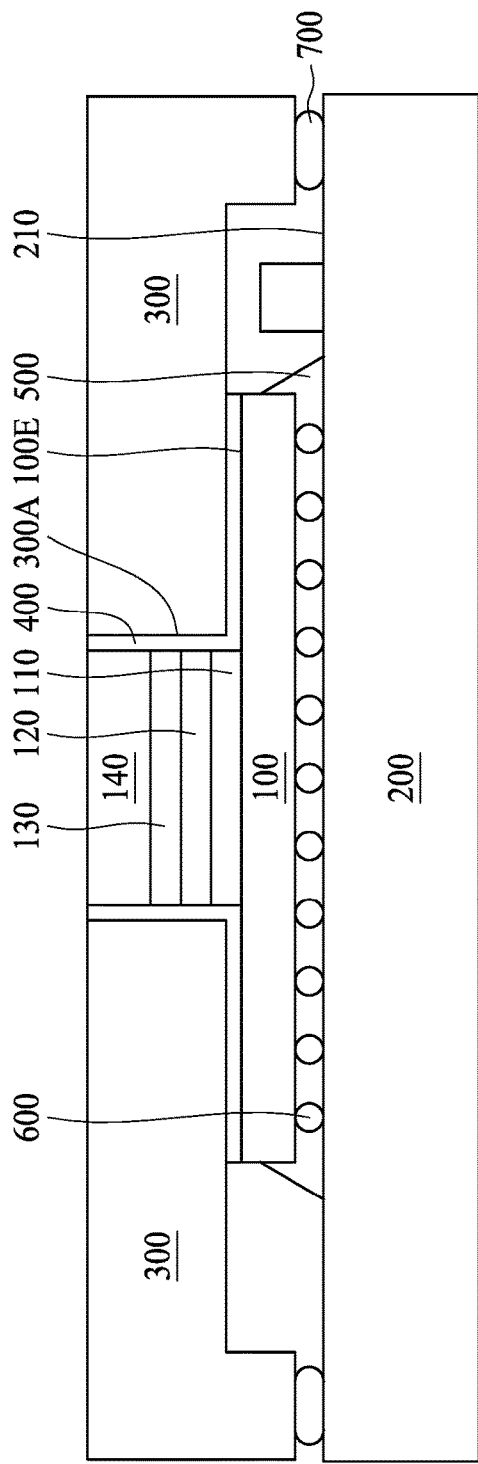
Figure 5C:
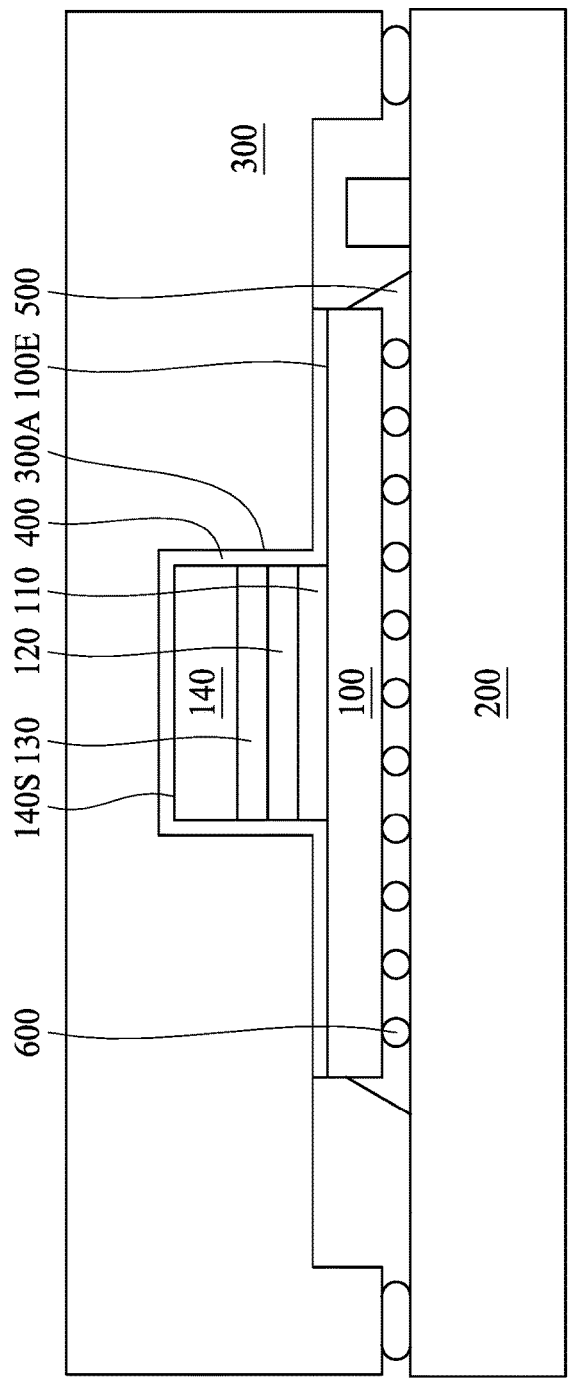

FIGS. 5B to 5C' illustrates the operations 504 to 506. A thermal interface material (TIM) 400 and a heat spreader 300 are provided and the heat spreader 300 is bonded on the block 100. In some embodiments, the provided heat spreader 300 has a contour ring shape (as shown in FIG. 3C) or a lid shape (as shown in FIG. 5C'). In some embodiments, the heat spreader 300 is bonded on the exposed surface 100E of block 100 and around the first die 110. In some embodiments, operations of dispensing the TIM 400 on the surface 100E of the block or on a surface 140S of the fourth die 140 are performed. In some embodiments, an operation of disposing the TIM 400 between a sidewall 300A of the heat spreader 300 and a sidewall of the first die 110 is performed. In some embodiments, an operation of disposing the TIM 400 between a surface of the heat spreader 300 and a surface 140S of the fourth die 140 is performed. In some embodiments, a bonding material 700 is provided and a portion of the heat spreader 300 is bonded on the substrate 200 through the bonding material 700. In some embodiments, the TIM 400 and the heat spreader 300 have similar configurations as the ones described above or illustrated in any one of FIG. 1 to FIG. 3.

Figure 6A:
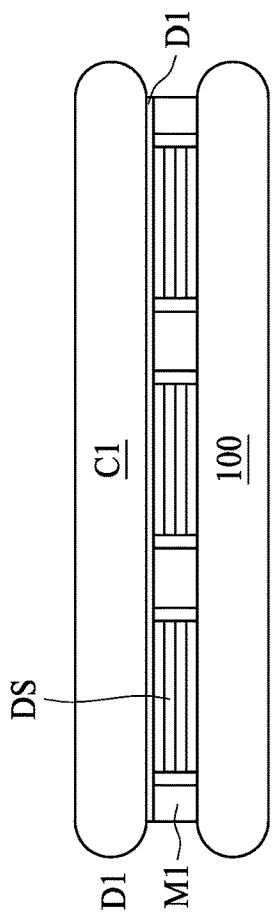
FIGS. 6A-6F are cross-sectional views of manufacturing a semiconductor structure in accordance with some embodiments of the present disclosure.
Figure 6B:
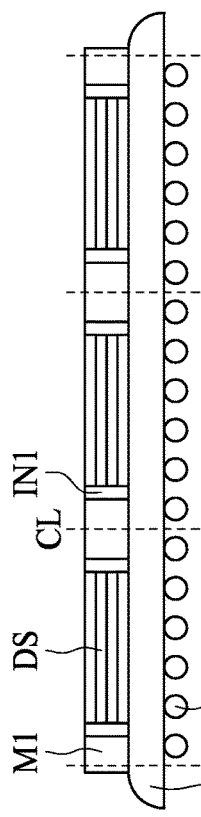
Figure 6C:
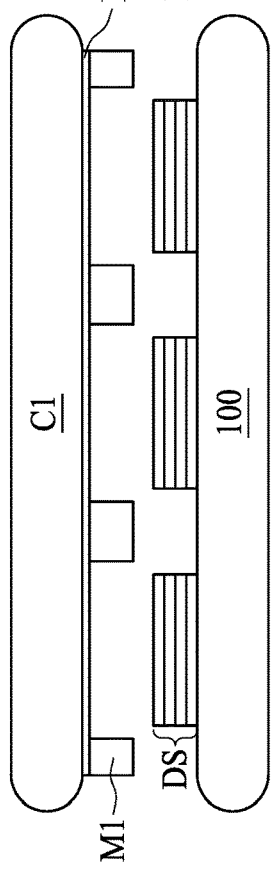
Figure 6D:
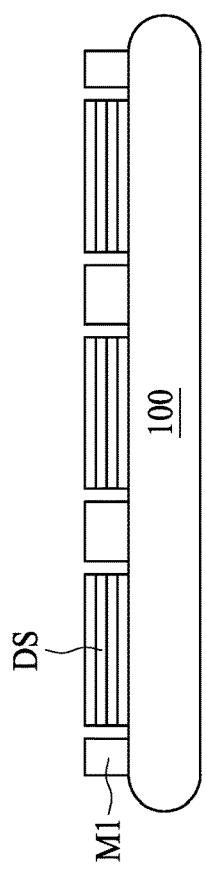
Figure 6E:
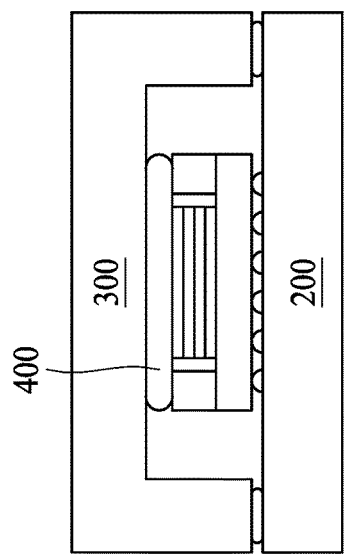
Figure 6F:
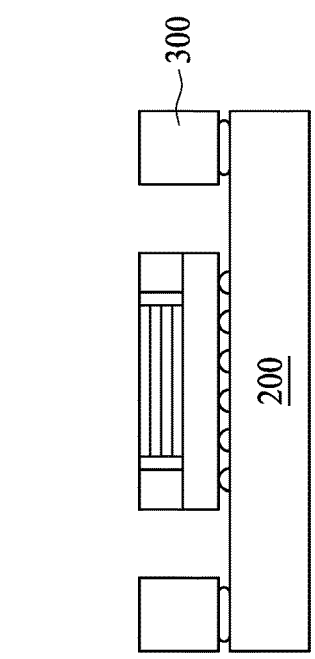

FIGS. 6A to 6F illustrates operations of a method of manufacturing a semiconductor structure. As shown in FIG. 6A, several die stacks DS are bonded on a block 100. In some embodiments, the die stacks DS are bonded on the block 100 by hybrid bonding. Several metal portions M1 are provided. In some embodiments, the metal portions M1 are fixed on a carrier C1 by a die attach film (DAF) D1. As shown in FIG. 6B, the metal portions M1 are bonded on the block 100 and around the die stacks DS. As shown in FIG. 6C, the carrier C1 and the DAF D1 are removed and separated from the metal portions M1. In some embodiments, the removal of the carrier C1 and the DAF D1 includes a laser operation. As shown in FIG. 6D, in some embodiments, an insulation material IN1 such as a molding compound or a thermal interface material (TIM) is disposed between the die stack DS and the metal portion M1. In some embodiments, the block 100 is processed to a desired thickness by operations such as a back side grinding operation. In some embodiments, several conductors 600 are attached to a surface of the block, the surface facing away from the die stack DS. In some embodiments, a dicing operation along cutting lines CL is performed for singulation of the semiconductor structure. As shown in FIGS. 6E and 6F, in some embodiments, the block 100 is bonded on a substrate 200 through the conductors 600. In some embodiments, a heat spreader 300 is bonded to the die stack DS or the metal portion M1 by a thermal interface material (TIM) 400.

Some embodiments of the present disclosure provide a semiconductor structure including a substrate, a first die over the substrate, a second die over the first die, a heat spreader having a sidewall facing toward and proximal to a sidewall of the first die, and a thermal interface material (TIM) between the sidewall of the first die and the sidewall of the heat spreader. A thermal conductivity of the heat spreader is higher than a thermal conductivity of the TIM.

Some embodiments of the present disclosure provide a semiconductor structure including a substrate, a block over the substrate and bonded with the substrate, a first die bonded on the block which has a surface exposed from the first die from a top view perspective, a second die over the first die, and a heat spreader having a surface facing toward and proximal to the exposed surface of the block. A thermal conductivity of the heat spreader is higher than a thermal conductivity of the block.

Some embodiments of the present disclosure provide a method for manufacturing a semiconductor structure including receiving a block, receiving a die, bonding the die on the block while exposing a surface of the block which surrounds the die from a top view perspective, receiving a thermal interface material (TIM), receiving a heat spreader, and bonding the heat spreader on the surface of the block and around the die while disposing the TIM between a sidewall of the heat spreader and a sidewall of the die.

Some embodiments of the present disclosure provide a semiconductor structure, comprising a substrate; a die stack disposed over the substrate, the die stack comprising a plurality of dies; a heat spreader disposed over the substrate, the heat spreader having a surface facing the substrate; and a thermal interface material (TIM) disposed between the die stack and the heat spreader, wherein a bottommost die of the die stack includes a surface exposed from remaining dies of the die stack from a top view perspective; and the TIM is in contact with the exposed surface of the bottommost die and the surface of the heat spreader, and is in contact with a sidewall of at least one of the plurality of dies of the die stack.

Some embodiments of the present disclosure provide a semiconductor structure, comprising a substrate; a die stack disposed over the substrate, the die stack being of a same type of memory dies; a logic die disposed between the die stack and the substrate, wherein the logic die has a region exposed by the die stack from a top view perspective; a metal-containing lid disposed over the substrate, the metal-containing lid having a surface facing the substrate; and a thermal interface material (TIM) disposed between the die stack and the metal-containing lid, wherein the TIM is in contact with the exposed region, a distal end of the logic die, and a sidewall of a topmost memory die of the die stack.

Some embodiments of the present disclosure provide a semiconductor structure, comprising a logic die; a die stack disposed over the logic die; a contoured lid disposed over the logic die and the die stack; and a thermal interface material (TIM) disposed between the die stack and the contoured lid, wherein the logic die has a region that is not covered by the die stack from a top view perspective; the contoured lid has a protruding portion with a first surface facing the logic die and a second surface facing the die stack; and the TIM contacts the first surface and the second surface of the contoured lid and the region of the logic die.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

The invention claimed is:

1. A semiconductor structure, comprising:
   a substrate;
   a die stack disposed over the substrate, the die stack comprising a plurality of dies;
   a heat spreader disposed over the substrate, the heat spreader having a surface facing the substrate; and
   a thermal interface material (TIM) disposed between the die stack and the heat spreader,
   wherein
   a bottommost die of the die stack includes a surface exposed from remaining dies of the die stack from a top view perspective; and
   the TIM is in contact with the exposed surface of the bottommost die and the surface of the heat spreader, and is in contact with a sidewall of at least one of the plurality of dies of the die stack.

2. The semiconductor structure of claim 1, wherein a thermal conductivity of the heat spreader is higher than a thermal conductivity of the TIM.

3. The semiconductor structure of claim 1, wherein a thermal conductivity of the heat spreader is higher than a thermal conductivity of each die of the die stack.

4. The semiconductor structure of claim 1, wherein the TIM is in contact with a sidewall of a topmost die of the die stack.

5. The semiconductor structure of claim 1, wherein the TIM is in contact with a top surface of a topmost die of the plurality of dies of the die stack.

6. The semiconductor structure of claim 1, wherein a portion of the TIM extends over the die stack.

7. The semiconductor structure of claim 1, wherein the TIM is between the exposed surface of the bottommost die and the surface of the heat spreader.

8. The semiconductor structure of claim 1, wherein the heat spreader has a lid shape.

9. The semiconductor structure of claim 1, wherein the exposed surface of the bottommost die laterally surrounds the remaining dies of the die stack from a top view perspective.

10. The semiconductor structure of claim 9, wherein sidewalls of the remaining dies of the die stack are aligned and in contact with the TIM.

11. A semiconductor structure, comprising:
    a substrate;
    a die stack disposed over the substrate, the die stack being of a same type of memory dies;
    a logic die disposed between the die stack and the substrate, wherein the logic die has a region exposed by the die stack from a top view perspective;
    a metal-containing lid disposed over the substrate, the metal-containing lid having a surface facing the substrate; and
    a thermal interface material (TIM) disposed between the die stack and the metal-containing lid, wherein the TIM is in contact with the exposed region, a distal end of the logic die, and a sidewall of a topmost memory die of the die stack.

12. The semiconductor structure of claim 11, wherein the memory dies are DRAM dies.

13. The semiconductor structure of claim 11, wherein a top surface of the die stack is covered by the metal-containing lid.

14. The semiconductor structure of claim 11, wherein the TIM is in contact with the exposed region of the logic die and the surface of the metal-containing lid.

15. The semiconductor structure of claim 11, wherein the surface of the heat spreader faces towards and is separated from the substrate.

16. The semiconductor structure of claim 11, wherein a peripheral portion of the metal-containing lid is attached to the substrate by a bonding material, wherein the bonding material at least partially surrounds the logic die.

17. The semiconductor structure of claim 11, wherein sidewalls of the memory dies are aligned and in contact with the TIM.

18. A semiconductor structure, comprising:
    a logic die;
    a die stack disposed over the logic die;
    a contoured lid disposed over the logic die and the die stack; and
    a thermal interface material (TIM) disposed between the die stack and the contoured lid,
    wherein the logic die has a region that is not covered by the die stack from a top view perspective;
    the contoured lid has a protruding portion with a first surface facing the logic die and a second surface facing the die stack; and
    the TIM contacts the first surface and the second surface of the contoured lid and the region of the logic die.

19. The semiconductor structure of claim 18, wherein the contoured lid has a third surface facing a top surface of the die stack.

20. The semiconductor structure of claim 19, wherein the TIM contacts the third surface of the contoured lid and the top surface of the die stack.

* * * * *